(12) United States Patent
Tanaka et al.

(10) Patent No.: US 7,776,654 B2
(45) Date of Patent: Aug. 17, 2010

(54) METHOD OF PRODUCING ELECTRONIC APPARATUS

(75) Inventors: Kousuke Tanaka, Chikusei (JP); Hironori Ishizaka, Chikusei (JP); Kouji Tasaki, Chikusei (JP); Masahito Shibutani, Chikusei (JP); Masahisa Shinzawa, Chikusei (JP); Shigehiro Konno, Chikusei (JP); Katsuya Iwata, Tokyo (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 356 days.

(21) Appl. No.: 11/911,847

(22) PCT Filed: Apr. 18, 2006

(86) PCT No.: PCT/JP2006/308134

§ 371 (c)(1),
(2), (4) Date: Oct. 18, 2007

(87) PCT Pub. No.: WO2006/112458

PCT Pub. Date: Oct. 26, 2006

(65) Prior Publication Data

US 2009/0061561 A1   Mar. 5, 2009

(30) Foreign Application Priority Data

Apr. 18, 2005 (JP) ............................. 2005-120168

(51) Int. Cl.
*H01L 21/58* (2006.01)
*H01L 21/67* (2006.01)
*H01L 21/677* (2006.01)

(52) U.S. Cl. .................. 438/110; 257/E21.499; 29/729; 29/739; 29/740; 198/469.1; 198/478.1; 198/617

(58) Field of Classification Search .............. 438/110; 257/E21.499; 29/729, 739, 740, 741; 198/469.1, 198/478.1, 617
See application file for complete search history.

(56) References Cited

U.S. PATENT DOCUMENTS 5,528,222 A * 6/1996 Moskowitz et al. ...... 340/572.7

(Continued)

FOREIGN PATENT DOCUMENTS

JP     11-145175     5/1999

(Continued)

OTHER PUBLICATIONS

Mitsuo Usami et al., Ubiquitous Technology—IC TAG, Ohmsha, Ltd, Mar. 25, 2005.

(Continued)

*Primary Examiner*—Mary Wilczewski
(74) *Attorney, Agent, or Firm*—Antonelli, Terry, Stout & Kraus, LLP.

(57) ABSTRACT

To provide a method of producing an electronic apparatus that is inexpensive, contributes to high productivity, and can achieve good communication characteristics. A method of producing an electronic apparatus composed of an IC chip (100) having an external electrode formed on each of a set of opposing surfaces of the IC chip; an antenna circuit (201) having a slit formed in it; and a short circuit plate (300) for electrically connecting the IC chip (100) and the antenna circuit (201). In the method, a disc-like conveyor (703) has hands (704) on its outer periphery, and each hand (704) is capable of holding a single IC chip (100). The hands (704) hold IC chips (100) individually, and the IC chips (100) are conveyed by rotation of the disc-like conveyor (703). As a result, a plurality of IC chips (100) whose maximum number is equal to the number of the hands (704) can be simultaneously conveyed.

9 Claims, 5 Drawing Sheets

U.S. PATENT DOCUMENTS

| | | | |
|---|---|---|---|
| 6,479,777 B2* | 11/2002 | Yamakawa | 209/574 |
| 6,732,498 B2* | 5/2004 | Keen et al. | 53/567 |
| 7,242,996 B2* | 7/2007 | Roesner | 700/117 |
| 7,278,203 B2* | 10/2007 | Aoyama et al. | 29/740 |
| 2001/0012645 A1* | 8/2001 | Usami | 438/108 |
| 2003/0036249 A1* | 2/2003 | Bauer et al. | 438/460 |
| 2003/0136503 A1* | 7/2003 | Green et al. | 156/264 |
| 2003/0211652 A1* | 11/2003 | Summers | 438/106 |
| 2004/0026519 A1 | 2/2004 | Usami et al. | |
| 2007/0161154 A1 | 7/2007 | Tanaka et al. | |
| 2009/0061561 A1* | 3/2009 | Tanaka et al. | 438/110 |

FOREIGN PATENT DOCUMENTS

| | | |
|---|---|---|
| JP | 2002-269520 | 9/2002 |
| JP | 2003-069294 | 3/2003 |
| JP | 2004-008313 | 1/2004 |
| JP | 2004-102353 | 4/2004 |
| JP | 2004-127230 | 4/2004 |
| JP | 2004-177974 | 6/2004 |

OTHER PUBLICATIONS

Office Action with partial translation of Chinese Application No. 2006800127538 dated Apr. 10, 2009.

Kayama Susumu and Naruse Kunihiko "VLSI Packaging Technology", first and second volumes, Nikkei BP, 1993.

M. Usami, et al., "Powder LSI: An Ultra Small RF Identification Chip for Individual Recognition Applications", ISSCC Digest of Technical Papers pp. 398-399, 2003.

* cited by examiner

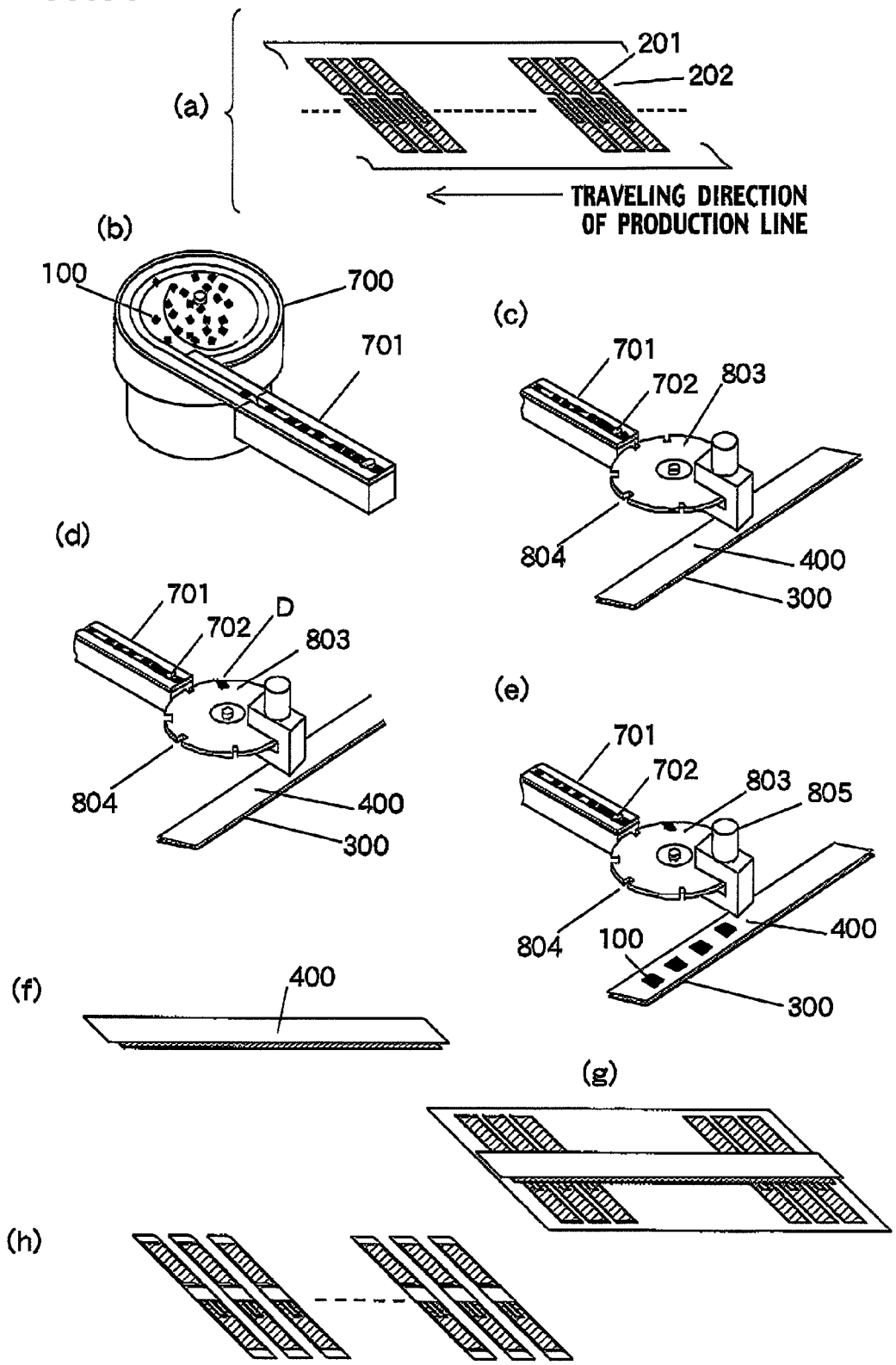

METHOD OF PRODUCING ELECTRONIC APPARATUS

TECHNICAL FIELD

The present invention relates to a method for producing economically and with improved productivity, an electronic device having good communications characteristics, used for a noncontact type individual identification device mounted with an IC chip.

BACKGROUND ART

In recent years non-contact type individual identification systems that employ RFID (Radio Frequency Identification) tags have been focused on for use in systems for managing the entire lifecycle of a product, including all commercial aspects of production of a product, it's distribution and sales. Radio wave type RFID tags that use 2.45 GHz microwaves are noted for the structure that includes an external antenna attached to an IC element that enables communication to be performed over several meters. Presently, construction is ongoing of systems that operate for distribution of mass-produced products as well as their product management and production history management.

Current examples of radio wave type RFID tag systems using microwaves include products developed by Hitachi or Renesas that use a TCP (Tape Carrier Package) inlet. The production of the TCP type inlet employs the TAB (Tape Automated Bonding) method in which IC elements having all external electrodes formed on the same surface thereof are mounted, each individually, on a tape carrier formed of a polymide substrate with a succession of copper antenna circuits (Kayama Susumu and Naruse Kunihiko "VLSI Packaging Technology", first and second volumes, Nikkei B P, 1993). RFID tag production processes employing a typical TAB method will now be described with reference to FIG. 1.

As shown in FIG. 1 (a), after IC elements 110 having a gold bump 104 formed on the circuit surface and in which all external electrodes are formed on the same surface are made individual by a dicing process, these are sucked from a dicing film 10 using a vacuum suction unit 20. Next, as shown in FIG. 1 (b), the pieces are moved to a vacuum suction station 30 so that the gold bumps 104 of the IC elements 110 having all external electrodes formed on the same surface thereof are made the surface. Next, as shown in FIG. 1 (c) the vacuum suction station 30 is inverted such that the gold bumps 104 become the lower face. Next, the IC elements 110 having all of the external electrodes thereof formed on the same surface are positioned in the determined position with respect to an antenna substrate 500, made by processing a polymide base with copper foil attached, and thereafter the IC elements 110 are secured in place by a thermal compression binding process using a heater 40. Connections can then be formed at the connecting parts of the gold bumps on an antenna circuit 501 by a tin-gold alloy formed by applying a tin or solder plating thereto. As shown in FIG. 1 (d), the gaps occurring between the IC elements 110 having all external electrodes formed on the same surface thereof and the antenna substrate 500 are sealed using a thermal hardenable resin 600. The condition once the hardening process of the thermal hardenable resin is complete is the intermediate condition of the RFID tag referred to as an inlet. Accommodating this inlet in a label or thin case enables it to be used as an RFID tag.

Other inlet structures include for example having IC chips in which the external electrodes of the IC chip are formed individually on the respective surfaces of a pair of facing surfaces, as developed by Usami of Hitachi, having a glass diode package structure in which a dipole antenna connects to each external electrode formed on the respective surfaces (Japanese Patent Application Laid-Open No. 2002-269520). Further, in the device disclosed by Usami et al, when the IC chip in which the above described two external electrodes are formed individually on each of the surfaces of a pair of facing surfaces of the IC chip are furnished with an oscillation slit type dipole antenna, the external electrodes formed individually on each of the surfaces of a pair of facing surfaces of the IC chip are disposed between antennae to produce a sandwich antenna construction (ISSCC Digest of Technical Papers pages 398-399, 2003). In this dipole antenna structure having an oscillation slit, the impedance of the antenna and input impedance of the IC chip can be made compatible by changing the width and length of the slit, thereby increasing the distance of achievable transmission.

In order to realize distribution and product management of a large number of products by a non-contact type individual identification system using RFID tags it is necessary to attach an RFID tag to each product, and this makes mass production of RFID tags cheaply indispensable.

However, in order to form a resonant circuit in which the two external electrodes of IC chips are connected to an antenna by spanning an oscillation slit in an oscillation type dipole antenna construction that provides favorable communication properties, it is necessary, in the case of IC chips in which all the external electrodes are formed on the same surface, to achieve precise positioning of the two external electrodes for signal input and the slit. Therefore, in the TAB method shown in FIG. 1 of the conventional art, the steps involved include suction from the dicing film applied to IC chips having all external electrodes formed on the same surface thereof and conveyance using a vacuum suction device, or positionally aligning and arranging IC chips having all external electrodes formed on the same surface with an antenna substrate, and further, performing thermal compression binding of the IC chips having all external electrodes formed on the same surface thereof to an antenna substrate, before sealing with resin is performed for each individual IC chip. In these processes, it is extremely troublesome to make the operating time for each step occur in one second or to reduce this below one second. This is a substantial problem affecting mass production in this method and thus the TAB method has significant problems.

Further, if the available operating time is long then labor expenses increase concomitantly, mitigating against lower-cost production. Also as the connection between IC chips having all external electrodes formed on the same surface thereof and an antenna substrate is realized using a gold-tin or gold solder connection, it is necessary to use as the substrate material, a taped substrate having copper foil attached to polymide film, which is expensive but strongly resistant to heat. This makes it very difficult to produce the inlet economically.

If the above described sandwich antenna construction is used, which encloses by an antenna each of the external electrodes formed individually on each of the surfaces of IC elements formed having two external electrodes each disposed individually on the respective surfaces that are a facing pair, when employing the production method of the conventional art that uses the TAB method in which it is not necessary to achieve precise positioning between an oscillation slit and each of the external electrodes formed individually on each of the surfaces of the IC elements, the production method incorporates processes to reduce the available operating time in which a plurality of the chips undergo suction and conveyance simultaneously using a plurality of vacuum suction devices. This creates problems however as complex production equipment is required which increases equipment investment costs, and it is difficult to perform mass production of the inlets at low cost.

Here, a method has been devised (refer Japanese Patent Application No. 2004-008313) in which the above-mentioned conveyance of the IC chips involves having a disc-like conveyor that provides a plurality of notches disposed on the outer periphery thereof, each of which can accommodate the insertion of one of the IC chips, having each of the IC chips accommodated by each of these notches and then rotating the disc-like conveyor so that a plurality of the IC chips the maximum number of which corresponds to the number of notches, can be simultaneously conveyed.

There are problems confronting this method that employs a disc-like conveyor however. When the IC chips are inserted into the notches the chips can become stuck to the notches, or the IC chips can become sandwiched between the disc-like conveyor and the base that supports that mechanism for example, preventing the equipment from running smoothly.

DISCLOSURE OF THE INVENTION

In light of the above, the object of the present invention is to provide a production method for producing an electronic device at low cost and with superior productivity where the device has satisfactory communication properties.

That is to say the present invention is as follows.

(1) A production method for an electronic device providing IC chips each having an external electrode formed respectively on each of the surfaces of an opposing pair, a transmission and reception antenna having a slit formed therein and a bridging plate that electrically connects the IC chips and the antenna, in which the IC chips are individually held in each of the hands of a disc-like conveyor having a plurality of hands around the periphery thereof each capable of holding a single IC chip, with the conveyance of the IC chips being performed by the rotation of this disc-like conveyor such that a plurality of the IC chips the maximum number of which corresponds to the number of hands can be simultaneously conveyed.

(2) A production method for an electronic device providing IC chips each having an external electrode formed respectively on each of the surfaces of an opposing pair, a transmission and reception antenna having a slit formed therein and a bridging plate that electrically connects the IC chip and the antenna, having at least a step for forming a plurality of antenna circuits using a first metallic foil and forming an antenna substrate by disposing the antenna circuits on a base substrate, or a step for forming an antenna substrate by providing a plurality of antenna circuits from the first metallic foil disposed on a base substrate; a step for arranging the IC chips; a step for holding the IC chips thus arranged one by one in each of a plurality of hands that are arranged around the outer periphery of a disc-like conveyor and are each capable of holding a single IC chip, and conveying those IC chips by rotating the disc-like conveyor; a step for arranging each of the IC chips thus conveyed via a first anisotropic conductive adhesive layer on a bridging plate forming a second metallic layer such that the IC chips are electrically connected, producing a bridging plate with IC chips attached; a step for positionally aligning the bridging plate with IC chips attached in the required position on the antenna circuits such that the IC chips are electrically connected; and a step for thermal compression binding the bridging plate with IC chips attached at once in the determined position over the antenna substrate via a second anisotropic conductive adhesive layer.

(3) A production method for an electronic device providing an IC chip having an external electrode formed respectively on each of the surfaces of an opposing pair, a transmission and reception antenna having a slit formed therein and a bridging plate that electrically connects the IC chip and the antenna, having at least a step for forming a plurality of antenna circuits using a first metallic foil and forming an antenna substrate by disposing the antenna circuits on a base substrate, or a step for forming an antenna substrate by providing a plurality of antenna circuits from the first metallic foil disposed on a base substrate; a step for arranging the IC chips; a step for holding the IC chips thus arranged one by one in each of a plurality of hands that are arranged around the outer periphery of a disc-like conveyor and are each capable of holding a single IC chip, and conveying those IC chips by rotating the disc-like conveyor; a step for arranging each of the IC chips thus conveyed, after each of them have been positionally aligned, via a first anisotropic conductive adhesive layer such that the IC chips are electrically connected in the determined positions on the antenna circuits; a step for positionally aligning a bridging plate forming a second metallic layer so as to be electrically connected in the determined position over the antenna circuits and the arranged IC chips; and a step for thermal compression binding the bridging plate at once in the determined position over the antenna substrate and the IC chips via a second anisotropic conductive adhesive layer.

(4) A production method for an electronic device providing an IC chip having an external electrode formed respectively on each of the surfaces of an opposing pair, a transmission and reception antenna having a slit formed therein and a bridging plate that electrically connects the IC chip and the antenna, having at least a step for forming a plurality of antenna circuits using a first metallic foil and forming an antenna substrate by disposing the antenna circuits on a base substrate, or a step for forming an antenna substrate by providing a plurality of antenna circuits from the first metallic foil disposed on a base substrate; a step for forming a first anisotropic conductive adhesive layer in the determined position over the antenna circuits; a step for arranging the IC chips; a step for holding the IC chips thus arranged one by one in each of a plurality of hands that are arranged around the outer periphery of a disc-like conveyor and are each capable of holding a single IC chip, and conveying those IC chips by rotating the disc-like conveyor; a step for arranging each of the IC chips thus conveyed, after each of them have been positionally aligned, via a first anisotropic conductive adhesive layer such that the IC chips are electrically connected in the determined positions on the antenna circuits; a step for forming a second anisotropic conductive adhesive layer in the determined position over the antenna circuits and the plurality of the IC chips thus arranged; a step for positionally aligning a bridging plate forming a second metallic layer so as to be electrically connected in the determined position over the antenna circuits and the arranged plurality of IC chips; and a step for thermal compression binding the bridging plate at once in the determined position over the antenna substrate and the IC chips.

(5) A production method for an electronic device that is any of the above-mentioned production methods wherein at least one from among the first or the second metallic layers is of aluminum.

(6) A production method for an electronic device that is any of the above-mentioned production methods wherein at least one from among the first or the second metallic layers is supported on a base substrate comprised of an organic resin, this organic resin being selected from among polyvinyl chloride (PVC), acrylonitrile butadiene styrene (ABS), polyethylene terephthalate (PET), polyethylene phthalate glycol (PETG), polyethylene naphthalate (PEN), polycarbonate resin (PC), bi-axial polyester (O-PET), or polymide resin.

(7) A production method for an electronic device that is any of the above-mentioned production methods wherein at least one from among the first or the second metallic layers is supported on a base substrate comprised of paper.

(8) A production method for an electronic device that is any of the above-mentioned production methods wherein the gap between the antenna substrate and bridging plate is sealed by thermal compression binding of the first and second anisotropic conductive adhesive layers.

(9) A production method for an electronic device that is any of the above-mentioned production methods, wherein after the step for thermal compression binding at once a plurality of the IC chips with the antenna substrates and a bridging plate there is included a step for cutting the continuum of antenna circuits into individual entities.

(10) A production method for an electronic device that is any of the above-mentioned production methods, wherein the bridging plate and the IC chips are thermal compression bound with the antenna substrates.

The production method for an electronic device according to the present invention finishes the following effects. As a plurality of the IC chips having an external electrode formed respectively on each of the surfaces of an opposing pair are held individually by a plurality of hands each capable of holding one IC chip which hands are arranged around the perimeter of a disc-like conveyor, and by the rotation of this disc-like conveyer a maximum number of the IC chips corresponding to the number of these hands are simultaneously conveyed, then even if the IC chips are each arranged on an antenna substrate and bridging plate superior productivity can be realized and improved communications characteristics are obtained. Further, the available operating time in the production of each inlet is reduced to one second or below one second, and as the IC chips and antenna substrate are connected with the bridging plate via an anisotropic conductive adhesive layers cheaper materials can be used for the base substrate and antenna circuit thereby enabling a more economical inlet to be realized.

BRIEF DESCRIPTION OF THE DRAWINGS

FIG. 5 shows the production steps describing the fourth embodiment of the present invention.

BEST MODE FOR CARRYING OUT THE INVENTION

The embodiments of the invention will now be described with reference to the drawings.

The electronic device of the present invention provides an IC chip having an external electrode formed respectively on each of the surfaces of an opposing pair of surfaces thereof, a transmission and reception antenna having a slit formed therein, and a bridging plate that electrically connects the IC chip and the antenna.

Figure 1:
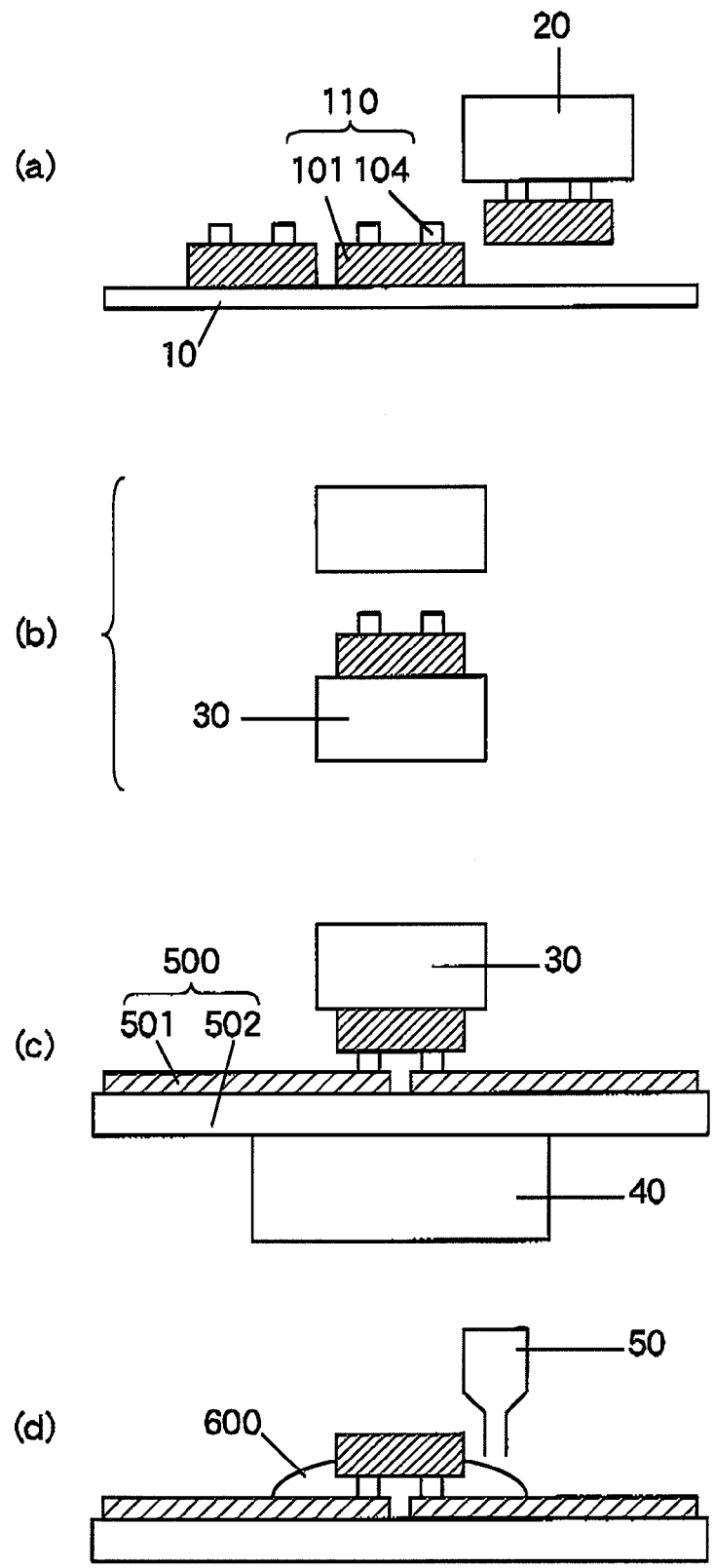
FIG. 1 depicts the conventional production method.
Figure 2:
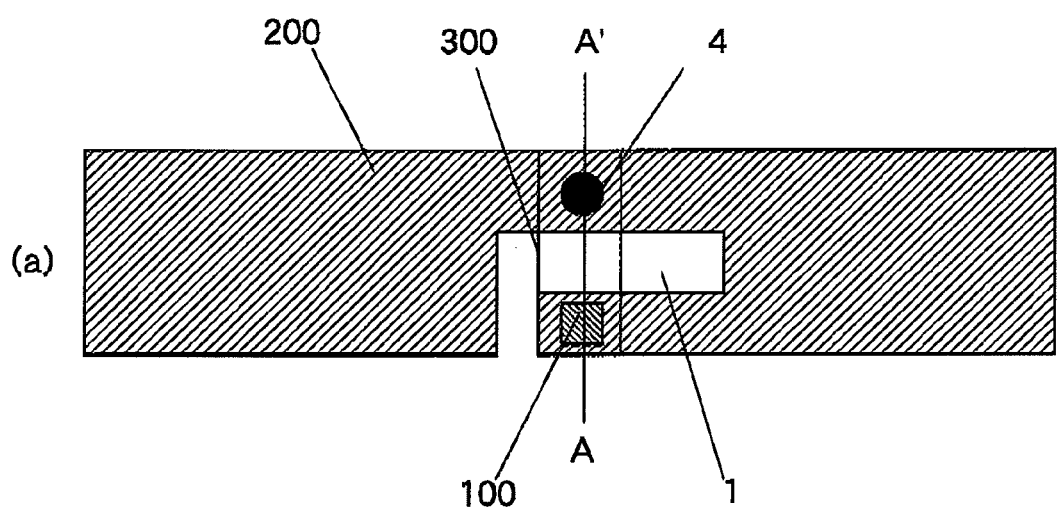
FIG. 2 shows the structure of an inlet obtained using the production method according to the present invention.
Figure 2:
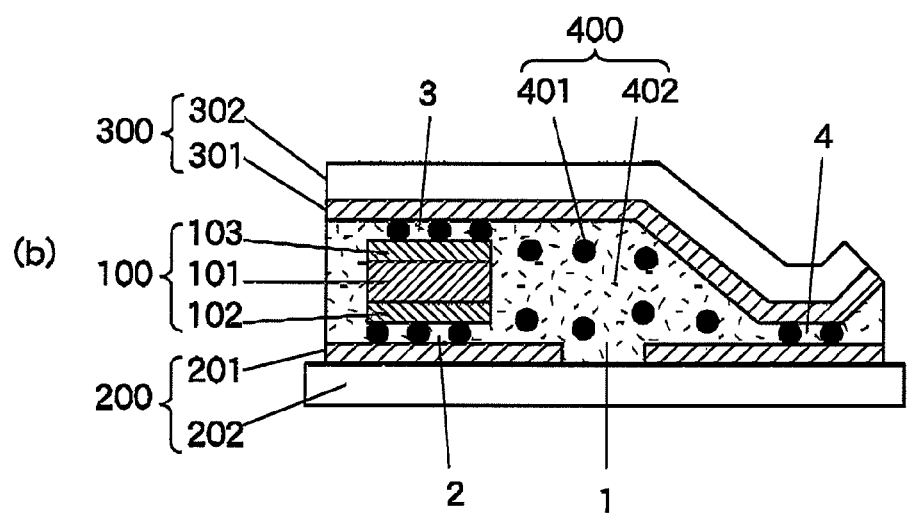

This electronic device is an inlet for an RFID tag that is made using the production method of the present invention. FIG. 2 (a) provides a schematic view from above of the inlet for an RFID tag. FIG. 2 (b) is a cross-sectional schematic view of the part A-A' in FIG. 1 (a). A simple description of the structure of the inlet will now be provided using FIG. 2.

As shown in FIG. 2 (b), a first external electrode 102 and a second external electrode 103 are formed respectively on the respective surfaces of a pair of opposing surfaces of the IC chip 100. The IC chip 100 is connected to an antenna substrate 200 comprised of a base substrate 202 and an antenna circuit 201 by the first external electrode 102 in a first connecting part 2 via conductive particles 401 contained in an anisotropic conductive adhesive layer 400. In the same manners in a second connecting part 3 the base substrate 302 and bridging plate 300 comprised of a metallic foil 301 are connected to the second external electrode 103 of the IC chip 100, while in a third connecting part 4, the bridging plate 300 is connected to the antenna substrate 200, each of these connecting parts connecting respectively via the conductive particles 401 contained in the anisotropic conductive adhesive layer 400. The second connecting part 3 of the second external electrode 103 of the IC chip and the third connecting part 4 on the antenna substrate are connected spanning a slit formed in the antenna substrate. That is to say, the second external electrode 103 and the first external electrode 102 of the IC chip are electrically connected via the first connecting part 2, the antenna circuit 201, the third connecting part 4, the bridging plate metallic foil 301 and the second connecting part 3. Further, the gap between the antenna substrate 200 and the bridging plate 300 is sealed by the matrix resin 402, an anisotropic conductive adhesive layer.

An example of the method of production for this electronic device will now be described with reference to the drawings.

The first example of a production method for the electronic device according to the present invention is a production method for an electronic device providing an IC chip having an external electrode formed respectively on each of the surfaces of an opposing pair, a transmission and reception antenna having a slit formed therein and a bridging plate that electrically connects the IC chip and the antenna, having at least, a step for forming a plurality of antenna circuits using a first metallic foil, and a step for forming an antenna substrate by disposing the antenna circuits on a base substrate or a step for forming an antenna substrate by providing a plurality of antenna circuits from the first metallic foil disposed on a base substrate; a step for arranging the IC chips; a step for holding the IC chips thus arranged one by one in each of a plurality of hands that are arranged around the outer periphery of a disc-like conveyor and are each capable of holding a single IC chip, and conveying those IC chips by rotating the disc-like conveyor; a step for arranging each of the IC chips thus conveyed via a first anisotropic conductive adhesive layer on a bridging plate forming a second metallic layer such that the IC chips are electrically connected, producing a bridging plate with IC chips attached; a step for positionally aligning the bridging plate with IC chips attached in the required position on the antenna circuits such that the IC chips are electrically connected; and a step for thermal compression binding the bridging plate with IC chips attached at once in the determined position over the antenna substrate via a second anisotropic conductive adhesive layer.

The second example of a production method for the electronic device according to the present invention is a production method for an electronic device providing an IC chip having an external electrode formed respectively on each of the surfaces of an opposing pairs a transmission and reception antenna having a slit formed therein and a bridging plate that electrically connects the IC chip and the antenna, having at least a step for forming a plurality of antenna circuits using a first metallic foil and a step for forming an antenna substrate by disposing the antenna circuits on a base substrate, or a step for forming an antenna substrate by providing a plurality of antenna circuits from the first metallic foil disposed on a base substrate; a step for arranging the IC chips; a step for holding the IC chips thus arranged one by one in each of a plurality of hands that are arranged around the outer periphery of a disc-like conveyor and are each capable of holding a single IC chip, and conveying those IC chips by rotating the disc-like conveyor; a step for arranging each of the IC chips thus conveyed, after each of them have been positionally aligned, via a first anisotropic conductive adhesive layer such that the IC chips are electrically connected in the determined positions on the antenna circuits; a step for positionally aligning a bridging plate forming a second metallic layer so as to be electrically connected in the determined position over the antenna circuits and the arranged IC chips; and a step for thermal compression binding the bridging plate at once in the determined position over the antenna substrate and the IC chips via a second anisotropic conductive adhesive layer.

Further, the third example of a production method for the electronic device according to the present invention is a production method for an electronic device providing an IC chip having an external electrode formed respectively on each of the surfaces of an opposing pair, a transmission and reception antenna having a slit formed therein and a bridging plate that electrically connects the IC chip and the antenna, having at least a step for forming a plurality of antenna circuits using a first metallic foil and a step for forming an antenna substrate by disposing the antenna circuits on a base substrate, or a step for forming an antenna substrate by providing a plurality of antenna circuits from the first metallic foil disposed on a base substrate; a step for forming a first anisotropic conductive adhesive layer in the determined position over the antenna circuits; a step for arranging the IC chips; a step for holding the IC chips thus arranged one by one in each of a plurality of hands that are arranged around the outer periphery of a disc-like conveyor and are each capable of holding a single IC chip, and conveying those IC chips by rotating the disc-like conveyor; a step for arranging each of the IC chips thus conveyed, after each of them have been positionally aligned, via a first anisotropic conductive adhesive layer such that the IC chips are electrically connected in the determined positions on the antenna circuits; a step for forming a second anisotropic conductive adhesive layer in the determined position over the antenna circuits and the plurality of IC chips thus arranged; a step for positionally aligning a bridging plate forming a second metallic layer so as to be electrically connected in the determined position over the antenna circuits and the arranged plurality of IC chips; and a step for thermal compression binding the bridging plate at once in the determined position over the antenna substrate and the IC chips.

In the first to third examples above, at least one of the first and second metallic foils is of aluminum.

In the first to third examples above, at least one of the first and second metallic foils is supported on an organic resin or a base substrate comprised of paper. This organic resin may be selected from polyvinyl chloride (PVC), acrylonitrile butadiene styrene (ABS), polyethylene terephthalate (PET), polyethylene terephthalate glycol (PETG), polyethylene naphthalate (PEN), polycarbonate resin (PC), bi-axial polyester (O-PET), or polymide resin.

In the first to third examples above, the method for forming the antenna substrate involves for example, using a first metallic foil and forming a plurality of antenna circuits, then disposing the plurality of antenna circuits on a base substrate to form an antenna substrate, or disposing a first metallic foil over a base substrate, then forming a plurality of antenna circuits by etching or the like, to form an antenna substrate.

The method for arranging the IC chips could involve for example a linear feeder or high-frequency parts feeder or high-speed bulk feeder arranging in lines, chip components of a chip resistor or chip condenser.

In the first to third examples above, a point of benefit is that when the method involves a step for dividing the bridging plate such that one piece is equivalent to the number of the IC chips in lines arranged in the widthwise direction of the antenna substrate, that can be subject to thermal compression binding at once, line by line, a step for positionally aligning the bridging plate in the determined position on the antenna circuits and a step for thermal compression binding of the bridging plat on the IC chips and the antenna substrate via an anisotropic conductive adhesive layer, then the available operating time can be reduced.

In the first to third examples above, an anisotropic conductive adhesive layer can be formed on the respective surfaces on which the external electrodes of an IC chip attach, and semiconductor elements can be used in a condition in which the IC chips are enclosed in advance by the anisotropic conductive adhesive layer, allowing the inlet to be produced with greater efficiency.

In the first to third examples above, the thermal compression binding of the first and second anisotropic conductive adhesive layers thermally press seals the plurality of the IC chips with the antenna substrate and bridging plate at once, and seals the gap between the antenna substrate and bridging plate.

In this case, making the total thickness of the first and second anisotropic conductive adhesive layers not less than half the thickness of one of the IC chips enables a good sealing of the antenna substrate and bridging plate to be realized and provides a high degree of reliability.

Dividing the bridging plate into a plurality of pieces prior to the thermal compression binding enables prevention of positional misalignment due to heat warp.

In the first to third examples above, an anisotropic conductive adhesive layer can be formed on the respective surfaces on which the external electrodes of an IC chips attaches, while the bridging plate can be disposed in advance on the surface of one of the anisotropic conductive adhesive layers of the semiconductor elements in a condition in which the IC chips are enclosed between the anisotropic conductive adhesive layers, thereby enabling the inlet to be produced with still greater efficiency.

In the first to third examples above, a method for disposing a second metallic foil on a base substrate for forming the bridging plate involves for example, a method in which a second metallic foil is simply adhered on the base substrate, and with no necessity of performing processes such as etching or the like for the second metallic foil, the process is completed swiftly, enabling the available operating time to be reduced and thereby realizing lower costs.

In the first to third examples above, after the process in which the bridging plate is thermal compression bound at once on the antenna substrate together with the IC chips via anisotropic conductive adhesive layers, a process is performed in which the continuum of antenna circuits is cut into individual pieces one by one.

In the first to third examples above, in the cutting process, when the line A-A' in FIG. 2 is taken as the widthwise direction, the bridging plate must have length sufficient to span the slit and accommodate the IC chips, while having length substantially equivalent to the width of the antenna circuits is preferable for enhancing the overall external appearance of the inlet.

In the first to third examples above, an inlet structure that is the electronic device according to the present invention can be obtained by performing each of the above steps.

An advantageous point about this inlet is that when used in the form of an RFID tag, providing a cover sheet above and below the inlet protects the circuit and prevents short-circuiting.

In the first to third examples above, holding the arranged IC chips one by one in each of a plurality of hands that are arranged around the outer periphery of a disc-like conveyor and that are each capable of holding a single IC chip, and conveying those IC chips by rotating the disc-like conveyor such that a plurality of the IC chips the maximum number of which corresponds to the number of the hands are simultaneously conveyed, means that even though the conveyed IC chips are arranged one by one in the determined position on the antenna circuits and the bridging plate, superior productivity is achieved in comparison to a method in which the IC chips are suction held one by one by a vacuum suction device and conveyed and arranged in place. Improving productivity in this way enables a reduction in the available operating time for each inlet.

In the first to third examples above, using the IC chips and bridging plate and making a connective structure that spans a slit, renders unnecessary high precision positional alignment of the external electrode on the face on that side of the IC chip that contacts the antenna circuit with the stimulation slit on the antenna circuit, thereby reducing the cost required for production equipment and enabling the IC chips to be conveyed faster In the first to third examples above, each of the electric connections of the IC chips with the antenna substrate and the bridging plate, and the bridging plate and the antenna substrate, are made via an anisotropic conductive adhesive layer. These connections via an anisotropic conductive adhesive layer are obtained by the contact between each of the external electrodes formed on each of the surfaces of the IC chip that provides the connective body, with conductive particles included within the anisotropic conductive adhesive layer, while the non-necessity of a surface coating over the antenna substrate, and the non-necessity of a highly heat resistant base substrate that can withstand bonding at temperatures of above 200° C. in order to form a metallic connection, mean that it is possible to use a cheap base material and antenna circuit, thereby enabling cost reductions.

As the above described electric connection is made via an anisotropic conductive adhesive layer, in contrast to the case of the conventional art in which for example it is necessary when making a connection by a gold-tin alloy or the like to use a highly heat resistant polymide as the base material for the antenna substrate, it is possible to use cheaper polyethylene terephthalate. Further, as it is not necessary to use tin plating on the surface over the antenna circuit at the connecting parts, it is possible to use the cheaper aluminum that does not conform well with a tin or solder coating as the material for the antenna circuit. Accordingly, an antenna substrate made by forming an aluminum antenna circuit on a polyethylene terephthalate base substrate provides a satisfactory member for the production of an inlet for a cheap RFID tag.

In the first example above, the first anisotropic conductive adhesive layer can be formed in advance on the bridging plate, or it can be formed on the second external electrode side of the IC chip. Again, the second anisotropic conductive adhesive layer can be formed in advance on the antenna substrate or it may be formed on the first external electrode 102 side of the IC chip.

In the second example above the first anisotropic conductive adhesive layer can be formed in advance on the antenna substrate, or it can be formed on the first external electrode 102 side of the IC chip. Again, the second anisotropic conductive adhesive layer can be formed in advance on the bridging plate or it may be formed on the IC chip and antenna circuit.

That is to say, the production method for an electronic device according to the present invention is a production method for an electronic device providing an IC chip having an external electrode formed respectively on each of the surfaces of the opposing pair, a transmission and reception antenna having a slit formed therein and a bridging plate that electrically connects the IC chip and the antenna, in which the conveyance of the IC chips is performed by holding the IC chips one by one in each of a plurality of hands that are arranged around the outer periphery of a disc-like conveyor and that are each capable of holding a single IC chip, and conveying those IC chips by rotating the disc-like conveyor, such that a plurality of the IC chips the maximum number of which corresponds to the number of the hands can be simultaneously conveyed.

As described with respect to the first to third examples above, the IC chips are held one by one in each of a plurality of hands that are arranged around the outer periphery of a disc-like conveyor and that are each capable of holding a single IC chip and a plurality of the IC chips the maximum number of which corresponds to the number of hands can be simultaneously conveyed by the rotation of that disc-like conveyor, thus even though the IC chips are individually arranged so as to be electrically connected with the bridging plate and the antenna substrate there is a remarkable improvement in the productivity when producing this inlet.

EMBODIMENTS

Exemplary embodiments of the present invention will now be described with reference to the drawings, provided it is understood that the invention is not limited thereby and the following description is illustrative rather than restrictive.

FIG. 2 (a) shows an embodiment of the present invention, providing a schematic view from above of an inlet for an RFID tag produced using the production method of the present invention. FIG. 2 (b) is a cross-sectional schematic view of the part A-A' in FIG. 2 (a). A simple description of the structure of the inlet will now be provided using FIG. 2.

As shown in FIG. 2 (b), a first external electrode 102 and a second external electrode 103 are formed respectively on the respective surfaces of the pair of opposing surfaces of the IC chip 100. The IC chip 100 is connected to an antenna substrate 200 comprised of a base substrate 202 and an antenna circuit 201 by the first external electrode 102 in a first connecting part 2 via conductive particles 401 contained in an anisotropic conductive adhesive layer 400. In the same manner, in a second connecting part 3 the base substrate 302 and bridging plate 300 comprised of a metallic foil 301 are connected to the second external electrode 103 of the IC chip 100, while in a third connecting part 4 the bridging plate 300 is connected to the antenna substrate 200, each of these connecting parts connecting respectively via the conductive particles 401. That is to say, the second connecting part 3 of the second external electrode 103 of the IC chip and the third connecting part 4 on the antenna substrate are connected spanning a slit formed in the antenna substrate. The second external electrode 103 and the first external electrode 102 of the IC chip are electrically connected via the first connecting part 2, the antenna circuit 201, the third connecting part 4, the bridging plate metallic foil 301 and the second connecting part 3. Further, the gap between the antenna substrate 200 and the bridging plate 300 is sealed by a matrix resin 402, an anisotropic conductive adhesive layer.

Embodiment 1

A first embodiment of the present invention will now be described with reference to FIG. 3.

Figure 3:
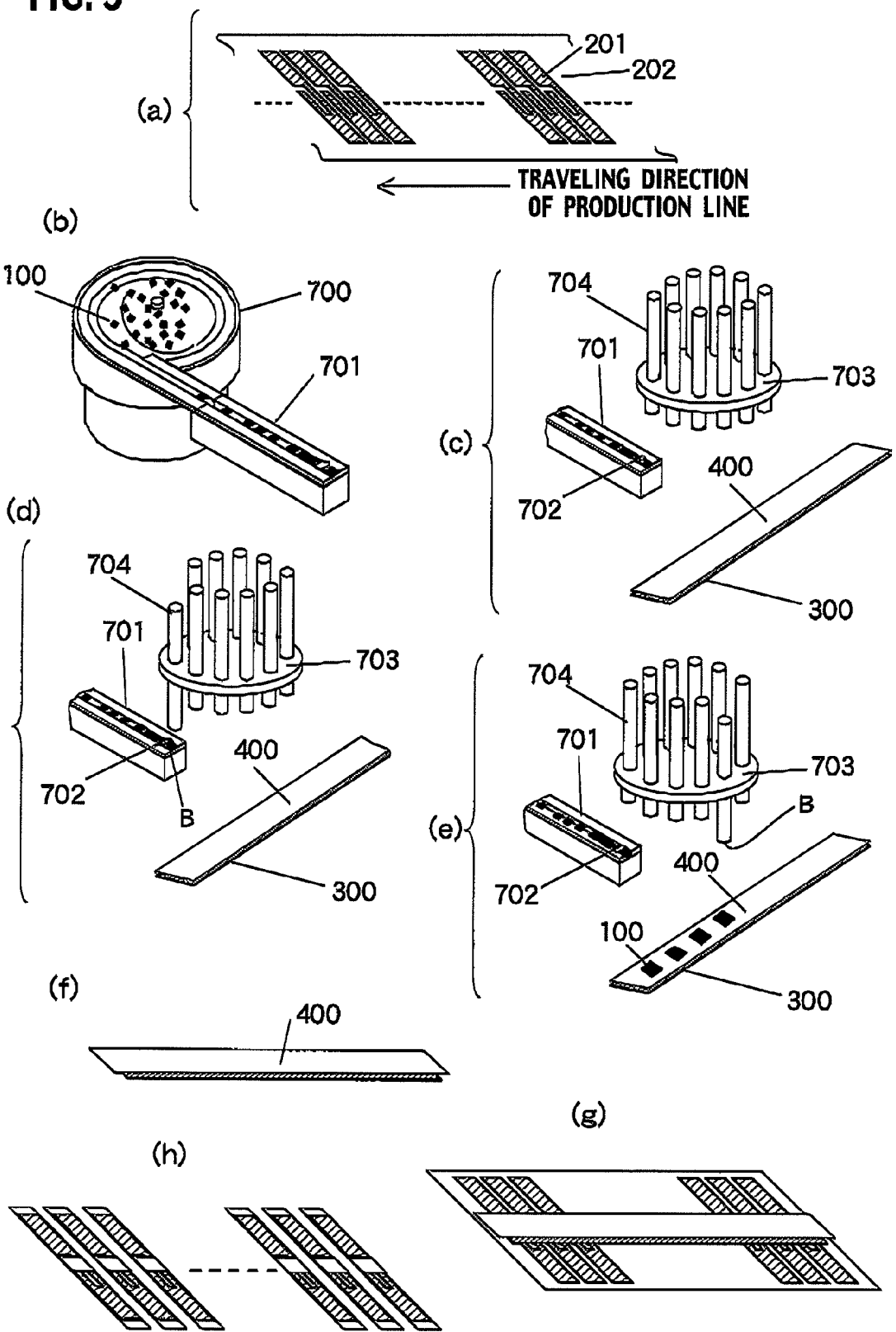
FIG. 3 shows the production steps describing the first embodiment of the present invention.

As shown in FIG. 3 (a), an etching resist is formed by screen printing on an aluminum foil surface of a tape form substrate produced by adhering aluminum foil of a thickness of 9 μm to a polyethylene terephthalate substrate 202 of a thickness of 50 μm using an adhesive agent. Next, an antenna circuit 201 is formed continuously on the aluminum foil surface using ferric chloride solution as an etching liquid. Here, the antenna thickness for each antenna circuit is 2.5 mm, the thickness of the slit is 0.5 mm, and the antenna circuits are formed at a pitch of 3 mm.

As shown in FIG. 3 b), after approximately 10000 IC chips 100 each having a thickness of 0.15 mm and a length and width both of 0.4 mm and having an external electrode formed respectively on the surfaces of each of the opposing pair of surfaces thereof are supplied to a high frequency parts feeder 700, that high-frequency parts feeder and a linear feeder 701 connected thereto are made to vibrate continuously at a frequency of 280 Hz, arranging the IC chips in a line over the linear feeder.

Thereafter, as shown in FIG. 3 (c), an anisotropic conductive adhesive layer is prepared, formed on the aluminum foil surface of a bridging plate 300, (which is formed by adhering aluminum foil of a thickness of 9 μm using adhesive agent in place on a substrate of polyethylene terephthalate having a thickness of 50 μm, a length of 50 m and 2 mm wide), by lamination at a temperature of 80° C. of an anisotropic conductive adhesive film 400 (AC-2052P-45 by Hitachi Chemical Co. Ltd.) having a width of 2 mm and a length of 50 m, and then removal of the separator film. Here, the linear feeder 701, disc-like conveyor 703 having arranged around the outer periphery thereof, a plurality of hands 704 each capable of holding a single IC chip and the anisotropic conductive adhesive layer are arranged facing upwards. Note that pin 702 is attached at the end of the linear feeder to prevent IC chips from falling due to the vibrations and ensure that only one IC chip held in a hand on the disc-like conveyor is separated.

Next, as shown in FIG. 3 (d), the pin 702 at the end of the linear feeder 701 is lowered, and after the single IC chip B only, that is arranged at the end of the linear feeder is removed, the hand 704 of the disc-like conveyor 703 that is stopped in the position aligned to the linear feeder is lowered and the single separated IC chip B is held by the tip of the hand 704, before the hand is raised and the disc-like conveyor rotated. At this time, the pin at the end of the linear feeder is raised to prevent the IC chip to be held thereafter from falling and the disc-like conveyer stops rotating in the position in which the hand to hold the next chip is aligned in contact with the linear feeder. Further, the holding of the IC chip at the end of the hand 704 of the disc-like conveyor 703 occurs by a vacuum suction action and thus an opening is formed in the hand 704.

Next, as shown in FIG. 3 (e), once the IC chip B held in the hand 704 of the disc-like conveyor 703 is in position over the anisotropic conductive adhesive layer 400 the hand 704 of the disc-like conveyor 703 is lowered and the vacuum suction holding the IC chip B is stopped, securing the IC chip B on the anisotropic conductive adhesive layer, and the bridging plate having that layer 400 moves 3 mm. By repeating over and over again this sequence of actions 40 of the IC chips come to the arranged on the anisotropic conductive adhesive layer formed on the bridging plate at intervals of 3 mm. At this point, the disk-like conveyor has provided 20 hands around the outer periphery, the disc-like conveyor has rotated at a speed on 0.3 rotations per second and the bridging plate having that anisotropic conductive adhesive layer has moved at 18 mm per second.

Next, as shown in FIG. 3 (f), after the anisotropic conductive adhesive film 400 is laminated at a temperature of 80° C. over the surface of the external electrodes on the side opposite to the external electrodes on the side of the IC chips closest to the bridging plate, the separator film is then removed to form an anisotropic conductive adhesive layer, thus producing a bridging plate with 40 IC chips attached arranged in a line at a pitch of 3 mm. At this time, the respective surfaces of the IC chips each having an external electrode attached thereto are in a condition sandwiched between the anisotropic conductive adhesive layers.

Thereafter, as shown in FIG. 3 (g), using a CCD camera and image processing device, the IC chips of the bridging plate with IC chips attached are secured tentatively in place faced for connection on the antenna substrate, as the IC chips viewed from over the anisotropic conductive adhesive layer of the bridging plate with IC chips attached are positionally aligned in the determined position over the antenna circuit. Further, instead of using a CCD camera and image processing device, it should be no problem to position the IC chip with precision by visual observation from above the anisotropic conductive adhesive layer. Thereafter, a press applying head is lowered from the bridging plate side, and the bridging plate with IC chips attached is thermally compression bound at once in the determined position with respect to 1 row of antenna circuits arranged in the widthwise direction of the antenna substrate at a pressure of 3 MPa, at 180° C. with the heat being applied for 15 seconds, while the gaps between the antenna substrate and the bridging plate are sealed. A protrusion having the thickness of the IC chip is formed in the determined position on the press applying head such that the connection of the IC chip and the antenna substrate with the bridging plate and the connection of the bridging plate with the antenna substrate can be performed simultaneously.

Next, as shown in FIG. 3 (h) a press cutting machine is used to cut the arrangement into individual pieces thereby obtaining the inlet construction of the form as shown in FIG. 2.

By using the above described processes the time required for the conveyance and arrangement of the IC chips is 0.167 seconds per inlet while the time required for connection of the bridging plate with the IC chips attached to the antenna substrate is 0.375 seconds per inlet. Where a plurality of pressing heads are used the operating time per inlet can be further reduced.

Further, the precision achieved in the position of the mounting of the IC chips is kept within ±0.3 mm of the prescribed position and no detrimental effects in assembly or affecting transmission occur due to positional misalignment.

Embodiment 2

A second embodiment of the present invention will now be described with reference to FIG. 4.

Figure 4:
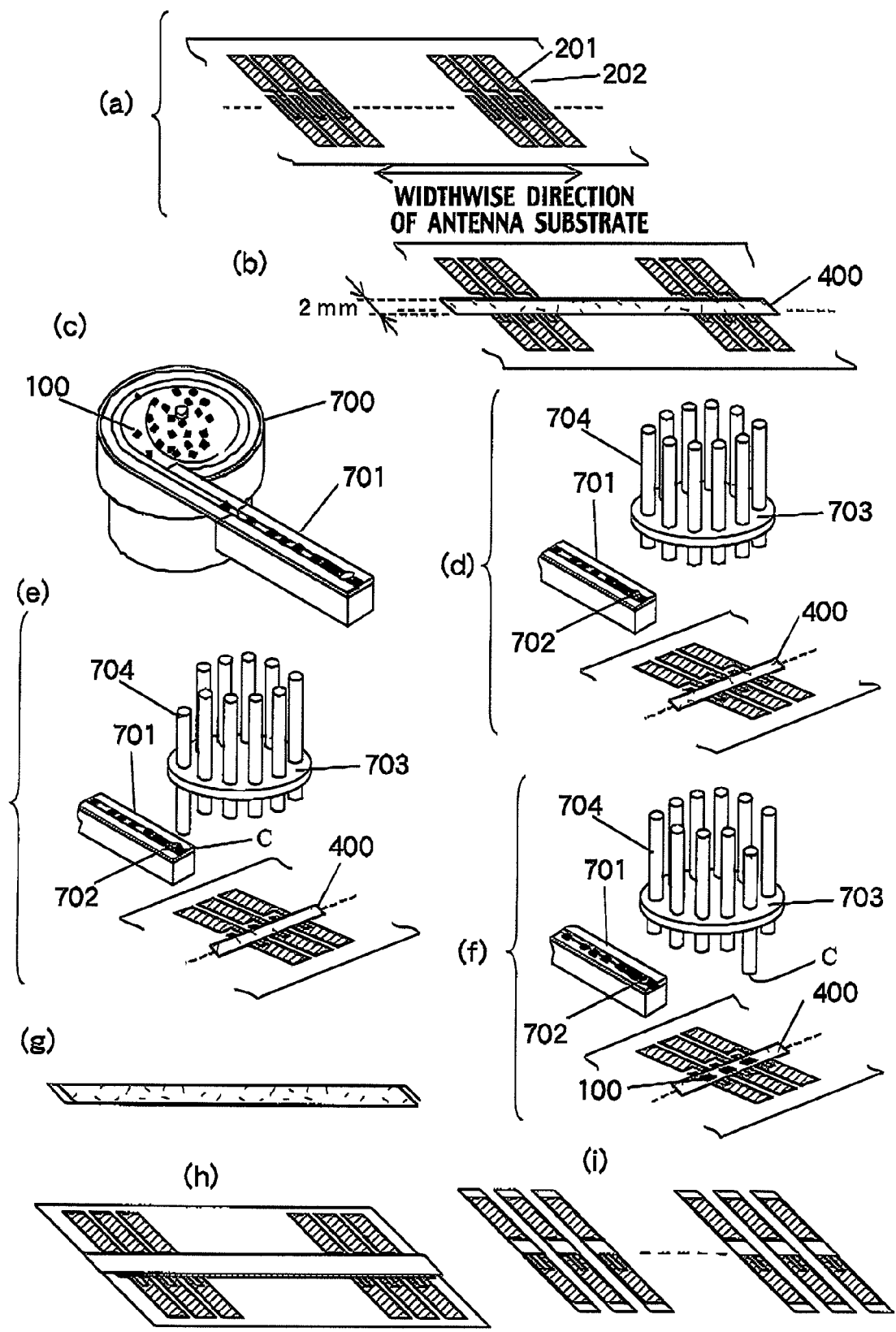
FIG. 4 shows the production steps describing the second embodiment of the present invention.

As shown in FIG. 4 (a), an etching resist is formed by screen printing on an aluminum foil surface of a tape form substrate produced by adhering aluminum foil of a thickness of 9 μm to a polyethylene terephthalate substrate 202 of a thickness of 50 μm using an adhesive agent. Next, an antenna circuit 201 is formed continuously on the aluminum foil surface using ferric chloride solution as an etching liquid. Here, the antenna thickness for each antenna circuit is 2.5 mm, the thickness of the slit is 0.5 mm, and the antenna circuits are formed at a pitch of 3 mm.

Next, as shown in FIG. 4 (*b*) an anisotropic conductive adhesive layer is formed in the determined position on an antenna circuit by lamination at a temperature of 80° C. of an anisotropic conductive adhesive film 400 (AC-2052P-45 by Hitachi Chemical Co. Ltd.) having a width of 2.5 mm, and then removal of the separator film.

Then, as shown in FIG. 4 (*c*), approximately 10000 IC chips 100 each having a thickness of 0.15 mm and a length and width both of 0.4 mm and having an external electrode formed respectively on the surfaces of each of an opposing pair of surfaces thereof are supplied to the high frequency parts feeder 700, and by vibrating in succession that parts feeder and the linear feeder 701 connected to that parts feeder at a frequency of 280 Hz the IC chips are arranged in a line over the linear feeder.

Thereafter, as shown in FIG. 4 (*d*), the linear feeder 701, disc-like conveyor 703 having arranged around the outer periphery thereof a plurality of hands 704 each capable of holding a single of the IC chips and the anisotropic conductive adhesive layer formed in the determined position over the antenna circuits are arranged facing upwards. Note that pin 702 is attached at the end of the linear feeder to prevent IC chips from falling due to the vibrations and ensure that only one the IC chip held in a hand on the disc-like conveyor is separated.

Next, as shown in FIG. 4 (*e*), the pin 702 at the end of the linear feeder 701 is lowered, and after the single IC chip C only, that is arranged at the end of the linear feeder is removed, the hand 704 of the disc-like conveyor 703 that is stopped in the position aligned to the linear feeder is lowered and the single separated IC chip C is held by the tip of the hand 704, before the hand is raised and the disc-like conveyor rotated. At this time, the pin at the end of the linear feeder is raised to prevent the IC chip to be held thereafter from falling and the disc-like conveyer stops rotating in the position in which the hand to hold the next chip is aligned in contact with the linear feeder. Further, the holding of the IC chip at the end of the hand 704 of the disc-like conveyor 703 occurs by a vacuum suction action and thus an opening is formed in the hand 704.

Next, as shown in FIG. 4 (*f*), once the IC chip C held in the hand 704 of the disc-like conveyor 703 is in position over the anisotropic conductive adhesive layer 400 the hand 704 of the disc-like conveyor 703 is lowered and the vacuum suction holding the IC chip C is stopped, securing the IC chip C on the anisotropic conductive adhesive layer, and the antenna circuits 201 having that anisotropic conductive adhesive layer move 3 mm. By repeating over and over again this sequence of actions 40 of the IC chips come to be arranged on the anisotropic conductive adhesive layer formed on the antenna circuits, at intervals of 3 mm. At this point, the disc-like conveyor has provides 20 hands around the outer periphery, the disc-like conveyor has rotated at a speed on 0.3 rotations per second and the bridging plate having that anisotropic conductive adhesive layer has moved at 18 mm per second.

Next, as shown in FIG. 4 (*g*), on the aluminum foil surface of a tape form substrate of 2 mm widthwise, which is formed by adhering aluminum foil of a thickness of 9 μm using adhesive agent in place on a substrate of polyethylene terephthalate having a thickness of 50 μm, the anisotropic conductive adhesive film 400 having the same width as that tape form substrate is laminated at 80° C., then the separator film is removed making a bridging plate with anisotropic conductive adhesive layer attached.

Thereafter, as shown in FIG. 4 (*h*), the bridging plate with anisotropic conductive adhesive layer attached and the antenna substrate are aligned in the determined position based on the respective external dimensions of those, and tentatively secured. A press applying head is lowered from the anisotropic conductive adhesive layer attached side of the bridging plate, and the bridging plate with the anisotropic conductive adhesive layer attached is thermally compression bound at once in the determined position with respect to 1 row of the antenna circuits and the IC chips arranged in the widthwise direction of the antenna substrate at a pressure of 3 MPa, at 180° C. with the heat being applied for 15 seconds, while the gaps between the antenna substrate and the bridging plate are sealed. A protrusion having the thickness of the IC chip is formed in the determined position on the press applying head such that the connection of the IC chip and the antenna substrate with the bridging plate and the connection of the bridging plate with the antenna substrate can be performed simultaneously.

Next, as shown in FIG. 4 (*i*), a press cutting machine is used for cutting into individual pieces thereby obtaining the inlet construction of the form as shown in FIG. 2.

In the same manner as applies with respect to embodiment 1, by using the above described processes the time required for the conveyance and arrangement of the IC chips is 0.167 seconds per inlet while the time required for connection of the bridging plate to the antenna substrate is 0.375 seconds per inlet. Where a plurality of pressing heads are used the available operating time per inlet can be further reduced.

Further, in the same manner as applies with respect to embodiment 1, the precision achieved in the position of the mounting of the IC chips is kept within ±0.3 mm, thus communication problems and faults during assembly due to positional misalignment are avoided.

Embodiment 3

The third embodiment will now be described.

Up until the step shown in FIG. 4 (*f*) the same processes are used as those with respect to embodiment 2, involving processing of the antenna substrate, laminating the anisotropic conductive adhesive film on the antenna circuit and forming the anisotropic conductive adhesive layer, arranging the IC chips having the external electrode formed on each of the surfaces of the pair of facing surfaces and then securing each of the IC chips in the determined position on the antenna circuit.

Next, an anisotropic conductive adhesive film of the same width as the above laminated anisotropic conductive adhesive film is laminated at 80° C. over the tentatively secured IC chips, and the separator film is then removed thus forming an anisotropic conductive adhesive layer.

Then, a tape form substrate 2 mm wide is prepared, by adhering aluminum foil of a thickness of 9 μm on a polyethylene terephalate substrate 50 μm thick using adhesive, thus making a bridging plate. With the aluminum foil surface side of the bridging plate facing the IC chips, the bridging plate is positionally aligned so as to be overlaid over the anisotropic conductive adhesive film, with the external dimensions in agreement and tentatively secured. Thereafter, a press applying head is lowered from the bridging plate side, and the bridging plate is thermally compression bound at once in the determined position with respect to the IC chips and antenna circuit at a pressure of 3 MPa, at 180° C. with the heat being applied for 15 seconds, while the gaps between the antenna substrate and the bridging plate are sealed. A protrusion having the thickness of the IC chip is formed in the determined position on the press applying head such that the connection of the IC chips and the antenna substrate with the bridging plate and the connection of the bridging plate with the antenna substrate can be performed simultaneously.

Next a press cutting machine is used to cut the arrangement into individual pieces thereby obtaining the inlet construction of the form as shown in FIG. 2.

In the same manner as applies with respect to embodiment 1 and embodiment 2, by using the above described processes the time required for the conveyance and arrangement of the IC chips is 0.167 seconds per inlet while the time required for connection of the bridging plate to the antenna substrate is 0.375 seconds per inlet. Where a plurality of pressing heads are used the operating time per inlet can be further reduced.

Further, in the same manner as applies with respect to embodiment 1 and embodiment 2, the precision achieved in the position of the mounting of the IC chips is kept within ±0.3 mm and no detrimental effects in assembly or affecting transmission occur due to positional misalignment.

Embodiment 4

The fourth embodiment will now be described with reference to FIG. 5.

Up until the step shown in FIG. 5 (b) the same processes are used as those with respect to embodiment 1, involving processing of the antenna substrate and arranging the IC chips over the linear feeder in a single line.

Next, as shown in FIG. 5 (c), on the aluminum foil surface of a bridging plate 300 formed by adhering aluminum foil of a thickness of 9 μm using adhesive agent in place on a substrate of polyethylene terephthalate 2 mm wide, 50 m long and having a thickness of 50 μm, anisotropic conductive adhesive film 400 (AC-2052P-45 by Hitachi Chemical Co. Ltd.) 2 mm wide and 50 m long is laminated at 80° C., then the separator film is removed thereby preparing the anisotropic conductive adhesive layer. Here, the linear feeder 701, disc-like conveyor 803 having arranged around the outer periphery thereof a plurality of notches 804 each capable of being inserted with one of the IC chips and the anisotropic conductive adhesive layer are arranged facing upwards. Note that pin 702 is attached at the end of the linear feeder to prevent the IC chip from falling due to the vibrations and ensure that only one the IC chip held in a notch on the disc-like conveyor is separated.

Thereafter, as shown in FIG. 5 (d), the pin 702 at the end of the linear feeder 701 is lowered, and after the single IC chip D only, that is arranged at the end of the linear feeder is inserted in the notch 804 of the disc-like conveyor 803, the disc-like conveyor is rotated. At this time, the pin at the end of the linear feeder is raised to prevent the next IC chip to be inserted from falling, and the disc-like conveyor rotates and stops in position aligned such that the notch to be inserted with the next IC chip is in connection with the linear feeder.

Next, as shown in FIG. 5 (e) the IC chip D inserted in the notch 804 of the disc-like conveyor 803 is in position over the anisotropic conductive adhesive layer 400, the IC chip D is removed from the notch by an auxiliary pin 805, secured on the anisotropic conductive adhesive layer and the bridging plate having that layer 400 moves 3 mm. By repeating over and over again this sequence of actions 40 of the IC chips come to be arranged on the anisotropic conductive adhesive layer formed on the bridging plate at intervals of 3 mm. At this point, the disc-like conveyor has provided 24 notches around the outer periphery, the disc-like conveyor has rotated at a speed of 0.25 rotations per second and the bridging plate having that anisotropic conductive adhesive layer has moved at 18 mm per second.

Following from the process shown in FIG. 5 (f) the same processes are employed as those used for embodiment 1, to obtain the inlet shown in FIG. 2.

By using the above described processes the time required for the conveyance and arrangement of the IC chips is 0.167 seconds per inlet. This 0.167 seconds however does not allow for equipment stoppage time as a result of an IC chip becoming caught in a notch which occurs once in every 2000 IC chips when they are inserted in the notch. The time required for connection of the bridging plate with IC chips attached to the antenna substrate is 0.375 seconds per inlet. Where a plurality of pressing heads are used the operating time per inlet can be further reduced.

Further, the precision achieved in the position of the mounting of the IC chips is kept within ±0.3 mm, thus communication problems and faults during assembly due to positional misalignment are avoided.

Embodiments 5

Firstly, an etching resist is formed by screen printing on an aluminum foil surface of a tape form substrate produced by adhering aluminum foil of a thickness of 9 μm to a polyethylene terephthalate substrate of a thickness of 50 μm using an adhesive agent. Next, an antenna circuit is formed continuously using ferric chloride solution as an etching liquid. Here, the antenna thickness for each antenna circuit is 2.5 mm, the thickness of the slit is 0.5 mm, and the antenna circuits are formed at a pitch of 3 mm.

Thereafter, an anisotropic conductive adhesive layer is prepared by lamination at a temperature of 80° C. of an anisotropic conductive adhesive film 400 (AC-2052P-45 by Hitachi Chemical Co. Ltd.) having a width of 2 mm in the determined position over the antenna substrate.

Then, approximately 3000 IC chips 100 each having a thickness of 0.15 mm and a length and width both of 0.4 mm and having an external electrode formed respectively on the surfaces of each of the opposing pair of surfaces thereof are prepared and inserted in a high speed bulk feeder mounted with a high-speed chip mounter. The IC chips expelled arranged in a single line from the high speed bulk feeder are successively conveyed to and arranged in their determined positions on the antenna substrate by the chip mounter.

Next, on the aluminum foil surface of a tape form substrate of 2 mm widthwise, which is formed by adhering aluminum foil of a thickness of 9 μm using adhesive agent in place on a substrate of polyethylene terephthalate having a thickness of 50 μm, anisotropic conductive adhesive film having the same width as that aluminum foil is laminated at 80° C., then the separator film is removed making a bridging plate with anisotropic conductive adhesive layer attached.

Thereafter, the bridging plate with anisotropic conductive adhesive layer attached and the antenna substrate are aligned in the determined position based on the respective external dimensions of those, and tentatively secured. A press applying head is lowered from the anisotropic conductive adhesive layer attached side of the bridging plate, and the bridging plate with the anisotropic conductive adhesive layer attached is thermally compression bound at once in the determined position with respect to the IC chips and the antenna circuits at a pressure of 3 MPa, at 180° C. with the heat being applied for 15 seconds, while the gaps between the antenna substrate and the bridging plate are sealed. A protrusion having the thickness of the IC chip is formed in the determined position on the press applying head such that the connection of the IC chip and the antenna substrate with the bridging plate and the connection of the bridging plate with the antenna substrate can be performed simultaneously.

A press cutting machine is used for cutting into individual pieces thereby obtaining the inlet construction of the form as shown in FIG. 2.

By using the above described processes the time required for the conveyance and arrangement of the IC chips is 0.2 seconds per inlet while the time required for connection of the bridging plate to the antenna substrate is 0.375 seconds per inlet.

Further, in the same manner as applies with respect to embodiment 1 and embodiment 2, the precision achieved in the position of the mounting of the IC chips is kept within ±0.3 mm, thus communication problems and faults during assembly due to positional misalignment are avoided.

A summary of the results of the above embodiments are shown in Table 1.

TABLE 1

| Embodiment | Time for IC chip conveyance and arrangement (seconds per unit) | Time for connection (seconds per unit) | Assembly errors (Defects/total) | Communications errors ((defects/total) | Comment |
|---|---|---|---|---|---|
| 1 | 0.167 | 0.375 | 0/2000 | 0/2000 | — |
| 2 | 0.167 | 0.375 | 0/2000 | 0/2000 | — |
| 3 | 0.167 | 0.375 | 0/2000 | 0/2000 | — |
| 4 | 0.167 Except when IC chip caught in notch and equipment stops | 0.375 | 0/2000 | 0/2000 | 1 chip per 2000 caught in notch, equipment stoppage. |
| 5 | 0.2 | 0.375 | 0/2000 | 0/2000 | — |

The invention claimed is:

1. A production method for an electronic device providing IC chips each having an external electrode formed respectively on each of the surfaces of an opposing pair, a transmission and reception antenna having a slit formed therein and a bridging plate that electrically connects the IC chips and the antenna, comprising the steps of:

forming a plurality of antenna circuits using a first metallic foil and forming an antenna substrate by disposing the antenna circuits on a base substrate, or forming an antenna substrate by providing a plurality of antenna circuits from the first metallic foil disposed on a base substrate;

arranging the IC chips;

holding the IC chips thus arranged one by one in each of a plurality of hands that are arranged around the outer periphery of a disc-like conveyor and are each capable of holding a single IC chip, and conveying those IC chips by rotating the disc-like conveyor;

arranging each of the IC chips thus conveyed via a first anisotropic conductive adhesive layer on a bridging plate forming a second metallic layer such that the IC chips are electrically connected, producing a bridging plate with IC chips attached;

positionally aligning the bridging plate with IC chips attached in the required position on the antenna circuits such that the IC chips are electrically connected; and thermal compression binding the bridging plate with IC chips attached at once in the determined position over the antenna substrate via a second anisotropic conductive adhesive layer.

2. A production method for an electronic device providing an IC chip having an external electrode formed respectively on each of the surfaces of an opposing pair, a transmission and reception antenna having a slit formed therein and a bridging plate that electrically connects the IC chips and the antenna, comprising the steps of:

forming a plurality of antenna circuits using a first metallic foil and forming an antenna substrate by disposing the antenna circuits on a base substrate, or forming an antenna substrate by providing a plurality of antenna circuits from the first metallic foil disposed on a base substrate;

arranging the IC chips;

holding the IC chips thus arranged one by one in each of a plurality of hands that are arranged around the outer periphery of a disc-like conveyor and are each capable of holding a single IC chip, and conveying those IC chips by rotating the disc-like conveyor;

arranging each of the IC chips thus conveyed, after each of them have been positionally aligned, via a first anisotropic conductive adhesive layer such that the IC chips are electrically connected in the determined positions on the antenna circuits;

positionally aligning a bridging plate forming a second metallic layer so as to be electrically connected in the determined position over the antenna circuits and the arranged IC chips; and thermal compression binding the bridging plate at once in the determined position over the antenna substrate and the IC chips via the second anisotropic conductive adhesive layer.

3. A production method for an electronic device providing an IC chip having an external electrode formed respectively on each of the surfaces of an opposing pair, a transmission and reception antenna having a slit formed therein and a bridging plate that electrically connects the IC chip and the antenna, comprising the steps of:

forming a plurality of antenna circuits using a first metallic foil and forming an antenna substrate by disposing the antenna circuits on a base substrate, or a step for forming an antenna substrate by providing a plurality of antenna circuits from the first metallic foil disposed on a base substrate;

forming a first anisotropic conductive adhesive layer in the determined position over the antenna circuits;

arranging the IC chips;

holding the IC chips thus arranged one by one in each of a plurality of hands that are arranged around the outer periphery of a disc-like conveyor and are each capable of holding a single IC chip, and conveying those IC chips by rotating the disc-like conveyor;

a step for arranging each of the IC chips thus conveyed, after each of them have been positionally aligned, via a first anisotropic conductive adhesive layer such that the IC chips are electrically connected in the determined positions on the antenna circuits;

forming a second anisotropic conductive adhesive layer in the determined position over the antenna circuits and the plurality of the IC chips thus arranged;

positionally aligning a bridging plate forming a second metallic layer so as to be electrically connected in the determined position over the antenna circuits and the arranged plurality of IC chips; and thermal compression binding the bridging plate at once in the determined position over the antenna substrate and the IC chips.

4. The production method for an electronic device according to any one of claims 1 through 3, wherein at least one from among the first or the second metallic layers is of aluminum.

5. The production method for an electronic device according to any one of claims 1 through 3, wherein at least one from among the first or the second metallic layers is supported on a base substrate comprised of an organic resin, this organic resin being selected from among polyvinyl chloride (PVC), acrylonitrile butadiene styrene (ABS), polyethylene terephthalate (PET), polyethylene terephthalate glycol (PETG), polyethylene naphthalate (PEN), polycarbonate resin (PC), bi-axial polyester (O-PET), or polymide resin.

6. The production method for an electronic device according to any one of claims 1 through 3, wherein at least one from among the first or the second metallic layers is supported on a base substrate comprised of paper.

7. The production method for an electronic device according to any one of claims 1 through 3, wherein the gap between the antenna substrate and bridging plate is sealed by thermal compression binding of the first and second anisotropic conductive adhesive layers.

8. The production method for an electronic device according to any one of claims 1 through 3, wherein after the step for thermal compression binding at once a plurality of the IC chips with the antenna substrates and a bridging plate there is included a step for cutting the continuum of antenna circuits into individual entities.

9. The production method for an electronic device according to any one of claims 1 through 3, wherein the bridging plate and the IC chips are thermal compression bound with the antenna substrates.

* * * * *